US006524170B2

(12) United States Patent
Srinivasan-Rao et al.

(10) Patent No.: US 6,524,170 B2
(45) Date of Patent: Feb. 25, 2003

(54) METHOD OF SURFACE PREPARATION OF NIOBIUM

(75) Inventors: Triveni Srinivasan-Rao, Shoreham, NY (US); John F. Schill, Ridge, NY (US)

(73) Assignee: Brookhaven Science Associates, LLC, Upton, NY (US)

(*) Notice: Subject to any disclaimer, the term of this patent is extended or adjusted under 35 U.S.C. 154(b) by 116 days.

(21) Appl. No.: 09/810,098

(22) Filed: Mar. 19, 2001

(65) Prior Publication Data

US 2002/0132565 A1 Sep. 19, 2002

(51) Int. Cl.[7] .......... H01L 39/02

(52) U.S. Cl. .......... 451/54; 451/41; 451/285; 257/10; 257/295

(58) Field of Search .......... 451/41, 54, 285–290, 451/36, 57, 59; 257/295, 10, 296; 427/533; 106/287.18

(56) References Cited

U.S. PATENT DOCUMENTS

| | | | | | |
|---|---|---|---|---|---|
| 3,939,053 | A | | 2/1976 | Diepers et al. | 204/212 |
| 4,014,765 | A | | 3/1977 | Roth et al. | 204/129 |
| 4,266,008 | A | | 5/1981 | Kampwirth et al. | 430/318 |
| 5,246,782 | A | * | 9/1993 | Kennedy et al. | 428/421 |
| 5,389,427 | A | * | 2/1995 | Berquier | 427/299 |
| 5,409,777 | A | * | 4/1995 | Kennedy et al. | 428/34.4 |
| 5,547,518 | A | | 8/1996 | Johnson et al. | 148/98 |
| 5,593,506 | A | | 1/1997 | Johnson et al. | 134/9 |
| 5,730,922 | A | * | 3/1998 | Babb et al. | 264/257 |
| 5,861,233 | A | * | 1/1999 | Sekine et al | 216/41 |
| 5,923,045 | A | | 7/1999 | Nihashi et al. | 257/10 |
| 6,335,269 | B1 | * | 1/2002 | Sato | 438/509 |

OTHER PUBLICATIONS

Bluem, et al., "Photocathode Electron Source Development at Advanced Energy Systems", 2000 EPAC, Jun. 2000, Vienna, Austria.

* cited by examiner

*Primary Examiner*—Joseph J. Hail, III
*Assistant Examiner*—Anthony Ojini
(74) *Attorney, Agent, or Firm*—Margaret C. Bogosian

(57) ABSTRACT

The present invention is for a method of preparing a surface of niobium. The preparation method includes polishing, cleaning, baking and irradiating the niobium surface whereby the resulting niobium surface has a high quantum efficiency.

21 Claims, No Drawings

METHOD OF SURFACE PREPARATION OF NIOBIUM

This invention was made with Government support under contract number DE-AC02-98CH10886, awarded by the U.S. Department of Energy. The Government has certain rights in the invention.

BACKGROUND OF THE INVENTION

1. Field of the Invention

The present invention is for a method of preparing a surface of niobium and more particularly a method of preparation for high quantum efficiency niobium surface.

Radio frequency, photocathode, electron guns are the source of choice for most high-performance accelerator systems. The main reason for this popularity is their ability to produce very bright beams of electrons. However, due to inherent limitations, photocathode radio frequency electron guns have not successfully penetrated certain key applications. One of these limitations is their inability to economically produce the high average current, high brightness electron beams necessary for certain applications. Another drawback is that one must choose between high quantum efficiency and durability. Durable cathodes tend to have relatively low quantum-efficiency, while high quantum efficiency cathode materials are very sensitive to vacuum conditions.

Superconducting Radio Frequency injectors are highly sought after for high brightness, high duty factor electron sources to be used in Free Election Lasers and for election cooling of ions. The major hurdle in its development is the lack of a suitable photocathode that has high quantum efficiency, long life time and compatible with the superconductivity of the injector. This surface preparation method for niobium increases the quantum efficiency from $10^{-6}$ to $10^{-3}$. This makes the construction of superconducting radio frequency injectors with niobium as the photocathode feasible.

2. Description of the Prior Art

U.S. Pat No. 5,923,045 to Nihashi, discloses a semiconductor photocathode. Nihashi teaches use of a semiconductor p-type materials in layers to comprise a photocathode which, with an externally applied voltage, accelerates and emits an electron generated in response to light incident. Examples of material for the third semiconductor layer include combinations of Cs—O, Cs—I, Cs—Te, Sb—Cs, Sb—Rb—Cs, Sb—K—Cs, Sb—Na—K, Sb—Na—K—Cs, and Ag—O—Cs. Nihashi does not suggest, disclose or teach the use of Nb as the semiconductor. Further, Nihashi only says the semiconductor "is prepared", or "etched". There is no disclosure of a method to prepare the layers.

U.S. Pat No. 3,939,053 to Diepers, discloses an apparatus for polishing of niobium structures. This apparatus is arranged for partial immersion in an electrolyte bath of H.sub.2 SO.sub.4, HF and H.sub.2O. Diepers does not suggest or teach a mechanical way to polish a sample. U.S. Pat No. 4,014,765 to Roth, discloses a method for electrolytic polishing of the inside surface of hollow niobium bodies.

U.S. Pat No. 4,266,008 to Kampwirth, discloses a method for etching thin films of niobium and niobium-containing compounds for preparing super conductive circuits. Kampwirth teaches contacting the film with an aqueous etchant of 8 to 10 w/o HNO.sub.3, 11 to 13 w/o H.sub.2 SO.sub.4 and 12 to 13 w/o HF for a period of time to remove the unmasked super conductive film from the substrate; and removing the photoresistive material from the surface of the super conductive film, thereby forming a thick film superconducting circuit on a non-conductive substrate. Kampwirth does not suggest or teach a mechanical way to polish niobium.

SUMMARY OF THE INVENTION

An object of the present invention is to provide a method to prepare niobium such that it is a high quantum efficiency material in order to be used as an efficient superconducting electron source.

A method of surface preparation of a chemically etched and cleaned niobium surface to produce a high quantum efficiency material by polishing includes removing coarse scratches and fine scratches. Then rinsing the niobium surface and cleaning the niobium surface to remove polishing material. The niobium surface may be blown with high purity nitrogen prior to cleanly transferring the niobium surface into a vacuum chamber. The chamber is pumped until background pressure is low and the niobium surface is baked. Lastly, the niobium surface irradiated with a laser.

A preferred form of the method, as well as other embodiments, features and advantages of this invention will be apparent from the following detailed description of illustrative embodiments thereof.

DETAILED DESCRIPTION

According to the present invention, a method of surface preparation of a chemically etched and cleaned niobium surface to produce a high quantum efficiency material begins with polishing the niobium surface to remove coarse scratches. The niobium surface may be a curved or a flat surface. It will be obvious to one skilled in the art the different niobium surfaces. In the preferred embodiment, the coarse scratches are removed by using an 800 grit sized abrasive paper on a polisher or any other equivalent means. In the preferred embodiment the abrasive paper is manufactured by Buehler and is Buehler Microcut 800 grit abrasive paper. The polisher is a Buehler Ecomet polisher. The polisher is run at a speed of 120 rpm and a pressure of 4 pounds for 2 minutes.

Next the niobium surface is polished to remove fine scratches. A fluid polishing extender may be used with the abrasive paper. The niobium surface can be mounted on a mechanical chuck or any other equivalent means to hold the niobium surface in a three point design, whereby the three points are adjusted such that all three surfaces are accurately leveled. Surface scratches are removed by polishing the niobium surface using Buehler Microcut 600 grit paper and Buehler Metadi fluid polish extender.

In the preferred embodiment, the fine scratches are removed by using a polishing cloth affixed to a platen. The platen is a Buehler Ecomet 5 polisher with automet 2 power head. Polishing compound is applied to the polishing cloth and the polishing cloth is rotated across the niobium surface. The polishing cloth is a Buehler Mastertex polishing cloth.

The polishing compound can be a diamond suspension polishing compound or any other equivalent means. The platen rotates at a speed of about 120 rpm and a pressure of about 3 pounds for about 90 seconds. It will be obvious to one skilled in the art any slight adjustments to the speed, pressure and time to achieve the desired result. Buehler Metadi 9 micron diamond suspension is sprayed on the polishing cloth to soak the cloth such that liquid is pooled on the cloth.

The niobium surface is then rinsed. In the preferred embodiment the niobium surface is rinsed with Hexane or other oxygen free organic solvents.

The polishing step is then repeated using a Buehler Metadi 6 micron diamond suspension polishing compound. Again the niobium surface is rinsed. The polishing step is then repeated using a Buehler Metadi 1 micron diamond suspension polishing compound with the polishing time reduced to 60 seconds. If necessary this step of polishing is repeated. It will be obvious to one skilled in the art to inspect the surface and repeat if necessary to achieve the desired result.

The niobium surface is cleaned to remove polishing material. The surface is rinsed completely with Hexane and placed in a Hexane bath for at least 20 minutes. In the preferred embodiment the niobium surface is cleaned by introducing the niobium surface to a Hexane bath in an ultrasonic cleaner to remove polishing material. In the preferred embodiment the niobium surface is next blown with high purity nitrogen at about 60 psi.

The niobium surface is introduced into a vacuum chamber and the chamber is pumped until background pressure is low. In the preferred embodiment the chamber background pressure is between $10^{-7}$ Torr and $10^{-8}$ Torr. Then the vacuum chamber is baked. In the preferred embodiment, the chamber is baked at about 100° C. for between 8 to 12 hours.

After baking the niobium surface is irradiated with a laser. In the preferred embodiment the niobium surface is irradiated with the laser for about 45 minutes. The laser density is approximately equal to 0.6 mJ per 1 mm diameter and the wavelength is about 266 nm. The laser pulse duration is about 12 ps. It will be obvious to one skilled in the art that the laser energy and laser spot size can be adjusted to yield the high quantum efficiency without damaging the niobium surface.

Although the invention is described herein with reference to the preferred embodiment, one skilled in the art will readily appreciate that other embodiments may be substituted for those set forth herein without departing from the spirit and scope of the present invention. As such, the described embodiments are not intended to be exhaustive or to limit the invention to the precise forms disclosed, and obviously many modifications and variations are possible in light of the above teaching. The embodiments were chosen and described in order to best explain the principles of the invention and its practical application. It is intended that the scope of the invention be defined by the claims appended hereto and their equivalents.

What is claimed is:

1. A method of surface preparation of a chemically etched and cleaned niobium surface to produce a high quantum efficiency material comprising:

a. polishing the niobium surface to remove coarse scratches;

b. polishing the niobium surface to remove fine scratches;

c. rinsing the niobium surface;

d. cleaning the niobium surface to remove polishing material;

e. introducing the niobium surface into a vacuum chamber and pumping the chamber until background pressure is low;

f. baking the vacuum chamber; and g. irradiating the niobium surface with a laser.

2. The method of claim 1 wherein the polishing of the niobium surface to remove the coarse scratches is by a. using abrasive paper on a polisher where the abrasive paper contains grit of about 800 grit size.

3. The method of claim 1 wherein the polishing of the niobium surface to remove coarse scratches is by a. using abrasive paper on a polisher where the abrasive paper contains grit of about 800 grit size and a fluid polishing extender; and b. mounting the niobium surface on a mechanical chuck to hold the niobium surface in a three point design, whereby the three points are adjusted such that all three surfaces are accurately leveled.

4. The method of claim 1 wherein the niobium surface is polished to remove fine scratches by a. using a polishing cloth affixed to a platen;

b. applying polishing compound to the polishing cloth; and c. rotating the polishing cloth across the niobium surface.

5. The method of claim 4 wherein the polishing compound is a diamond suspension polishing compound.

6. The method of claim 5 wherein the suspension is 9 micron suspension.

7. The method of claim 6 further comprising:

a. rinsing the niobium surface;

b. applying 6 micron suspension to the polishing cloth on a clean platen; and c. rotating the polishing cloth across the niobium surface.

8. The method of claim 7 further comprising:

a. rinsing the niobium surface;

b. applying 1 micron suspension to the polishing cloth; and c. rotating the polishing cloth across the niobium surface.

9. The method of claim 8 wherein the platen is rotating at a speed of about 120 rpm and a pressure of about 3 pounds for about 60 seconds.

10. The method of claim 7 wherein the platen is rotating at a speed of about 120 rpm and a pressure of about 3 pounds for about 90 seconds.

11. The method of claim 4 wherein the platen is rotating at a speed of about 120 rpm and a pressure of about 3 pounds for about 90 seconds.

12. The method of claim 1 wherein the niobium surface is rinsed with Hexane.

13. The method of claim 1 wherein the niobium surface is cleaned by introducing the niobium surface to a Hexane bath in an ultrasonic cleaner to remove polishing material.

14. The method of claim 13 wherein the niobium is in the Hexane bath for at least 20 minutes.

15. The method of claim 1 further comprising after cleaning the niobium surface to remove polishing material blowing the niobium surface with high purity nitrogen.

16. The method of claim 1 wherein the chamber background pressure is between $10^{-7}$ Torr and $10^{-8}$ Torr.

17. The method of claim 1 wherein the chamber is baked at about 100° C. for between 8 to 12 hours.

18. The method of claim 1 wherein the niobium:

a. is irradiated with the laser for about 45 minutes;

b. the laser density is approximately equal to 0.6 mJ per 1 mm diameter;

c. the laser wavelength is about 266 nm; and d. the laser pulse duration is about 12 ps.

19. The method of claim 18 further comprising:

a. adjusting laser energy and laser spot size to yield a high quantum efficiency without damaging the niobium surface.

20. A method of surface preparation of a chemically etched and cleaned niobium surface to produce superconducting material comprising:

a. polishing the niobium surface to remove coarse scratches;

b. polishing the niobium surface to remove fine scratches by using a polishing cloth affixed to a platen; applying a diamond polishing compound to the polishing cloth; rotating the polishing cloth across the niobium surface;

c. rinsing the niobium surface with Hexane;

d. cleaning the niobium surface to remove polishing material;

e. blowing the niobium surface with high purity nitrogen;

f. cleanly transferring the niobium surface into a vacuum chamber and pumping the chamber until background pressure is between $10^{-7}$ Torr and $10^{-8}$ Torr;

g. baking the vacuum chamber at about 100° C. for between 8 to 12 hours; and h. irradiating the niobium surface with a laser.

21. The method of claim 20 further comprising:

a polishing the niobium surface to remove fine scratches by using a polishing cloth affixed to a platen; applying a 1 micron diamond polishing compound to the polishing cloth; and rotating the polishing cloth across the niobium surface.

* * * * *